United States Patent
Haag et al.

(10) Patent No.: US 11,706,880 B2
(45) Date of Patent: Jul. 18, 2023

(54) EXPLOSION-PROOF PRESSURE-TIGHT HOUSING FOR ELECTRICAL OPERATING DEVICES

(71) Applicant: Siemens Aktiengesellschaft, Munich (DE)

(72) Inventors: Christian Haag, Karlsruhe (DE); Ralf Huck, Großkrotzenburg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 357 days.

(21) Appl. No.: 16/955,561

(22) PCT Filed: Dec. 21, 2018

(86) PCT No.: PCT/EP2018/086654
§ 371 (c)(1),
(2) Date: Jun. 18, 2020

(87) PCT Pub. No.: WO2019/122359
PCT Pub. Date: Jun. 27, 2019

(65) Prior Publication Data
US 2021/0100112 A1    Apr. 1, 2021

(30) Foreign Application Priority Data
Dec. 22, 2017   (DE) .................... 10 2017 223 733.3

(51) Int. Cl.
*H05K 5/00*    (2006.01)
*G06F 1/16*    (2006.01)

(52) U.S. Cl.
CPC .......... *H05K 5/0013* (2013.01); *G06F 1/1626* (2013.01)

(58) Field of Classification Search
CPC .......... H05K 5/0013; H05K 5/03; H05K 5/04; G06F 1/1626; H01H 9/04; H02G 3/088
See application file for complete search history.

(56) References Cited

U.S. PATENT DOCUMENTS

| 4,748,790 A | 6/1988 | Frangolacci |
| 5,669,522 A * | 9/1997 | Million ................ G01G 21/283 220/784 |

(Continued)

FOREIGN PATENT DOCUMENTS

| CN | 2720564 Y | 8/2005 |
| CN | 202888777 U | 4/2013 |

(Continued)

OTHER PUBLICATIONS

Office Action dated Jun. 30, 2021 issued in Chinese Patent Application No. 201880082837.1.

(Continued)

*Primary Examiner* — Hung S. Bui
*Assistant Examiner* — Sagar Shrestha
(74) *Attorney, Agent, or Firm* — Cozen O'Connor

(57) ABSTRACT

An explosion-proof pressure-tight housing for electrical operating device has a rigid lower shell and an elastic upper shell terminating the lower shell in the manner of a cover, wherein the lower shell includes a base, preferably formed as a rounded rectangle, and also includes side walls, the outer surfaces of which are inclined inwardly by an acute angle, where the elastic upper shell has a cover base and side walls, which are splayed outwardly at the angle, the inside width of the upper shell is smaller than the outside width of the lower shell, and the upper shell is pressed with the lower shell such that a flameproof gap is formed between the side walls of the upper shell and the side walls of the lower shell.

9 Claims, 2 Drawing Sheets

(56) References Cited

U.S. PATENT DOCUMENTS

| | | | |
|---|---|---|---|
| 5,880,400 A * | 3/1999 | Leischner | H02B 1/28 |
| | | | 174/17 CT |
| 5,880,401 A * | 3/1999 | Leischner | H02B 1/28 |
| | | | 174/17 CT |
| 7,838,768 B2 * | 11/2010 | Zadach | H05K 5/068 |
| | | | 361/679.01 |
| 8,020,901 B2 * | 9/2011 | Watanabe | B41J 29/00 |
| | | | 292/87 |
| 8,448,814 B2 * | 5/2013 | Yamamoto | H05K 5/0013 |
| | | | 403/345 |
| 2004/0022035 A1 * | 2/2004 | Chang | H05K 5/0269 |
| | | | 361/752 |
| 2005/0289573 A1 | 12/2005 | Guo et al. | |
| 2012/0099258 A1 * | 4/2012 | Chen | G06F 1/181 |
| | | | 361/679.01 |
| 2014/0233197 A1 * | 8/2014 | Schwab | H05K 5/03 |
| | | | 361/752 |
| 2015/0140372 A1 | 5/2015 | Kondo | |
| 2016/0044814 A1 * | 2/2016 | Drew | H05K 5/0004 |
| | | | 361/752 |
| 2016/0261099 A1 | 9/2016 | Brusius et al. | |
| 2017/0311460 A1 * | 10/2017 | Ozaki | H02G 15/06 |
| 2018/0048132 A1 * | 2/2018 | Dinh | H02G 3/081 |
| 2019/0223308 A1 | 7/2019 | Krumbholz et al. | |
| 2020/0038990 A1 * | 2/2020 | Coffey | H05K 5/04 |

FOREIGN PATENT DOCUMENTS

| | | |
|---|---|---|
| CN | 203225143 U | 10/2013 |
| CN | 203740380 U | 7/2014 |
| CN | 104659290 | 5/2015 |
| CN | 105659454 | 6/2016 |
| CN | 106332496 | 1/2017 |
| DE | 2112224 C3 | 4/1981 |
| DE | 2816691 C2 | 3/1983 |
| DE | 19634671 C2 | 8/1998 |
| DE | 19733237 C1 | 5/1999 |
| DE | 102007034569 | 2/2009 |
| DE | 102015106350 | 10/2016 |
| EP | 0233427 | 8/1987 |
| EP | 0827244 | 3/1998 |
| FR | 2549307 | 1/1985 |

OTHER PUBLICATIONS

Office Action dated Dec. 18, 2020 issued in Chinese Patent Application No. 201880082837.1.

PCT International Search Report dated Apr. 17, 2019 based on PCT/EP2018/086654 filed Dec. 21, 2018.

German Office Action dated Oct. 10, 2018 based on DE102017223733.3.

* cited by examiner

EXPLOSION-PROOF PRESSURE-TIGHT HOUSING FOR ELECTRICAL OPERATING DEVICES

CROSS-REFERENCE TO RELATED APPLICATIONS

This is a U.S. national stage of application No. PCT/EP2018/086654 filed 21 Dec. 2018. Priority is claimed on German Application No. 10 2017 223 733.3 filed 22 Dec. 2017, the content of which is incorporated herein by reference in its entirety.

BACKGROUND OF THE INVENTION

1. Field of the Invention

The invention relates to an explosion-proof pressure-tight housing for electrical operating means.

2. Description of the Related Art

Electrical products installed and operated in a potentially explosive environment must comply with statutory protection measures for preventing active sources of ignition in the context of explosion prevention. Housings of ignition protection type "Pressure-tight Encapsulation" ("Ex d") must withstand the pressure of an explosion of an explosive mixture in the interior and must prevent the transmission of the explosion outward. The explosion pressure depends on the free internal volume and on the shape of the housing. The housing must be correspondingly stable. To prevent the explosion from being transmitted outward through housing openings because of flameout (exit of a potential flame), a minimum gap length must not be undershot and a maximum gap height must not be exceeded for all housing gaps leading to the outside. Furthermore, the surface temperature at the housing external wall must not exceed the ignition temperature of the surrounding explosive atmosphere.

DE 21 12 224 C3 discloses an explosion-proof pressure-tight housing for electrical operating devices, consisting of a housing lower part and a cover with a cylindrical fitting portion that engages in the housing lower part to form a flameproof gap. The cover is fastened to the housing lower part by screws. To prevent the cylindrical fitting portion from being pressed inward in the sense of an enlargement of the gap in the event of an explosion in the interior of the housing and a resultant bulging of the cover base outward, the cover has an elastic zone in the transition region between the cylindrical fitting portion and the cover base.

DE 197 33 237 C1 discloses an explosion-proof plastic housing with a lower part and an upper part, which each have a rectangular base and side walls standing perpendicular thereto. The side walls of the upper part project into the lower part, such that the walls of the lower part partially protrude over the side walls of the upper part. Latching hooks are integrally molded on the walls of the lower part, and engage on counter-bearings formed on the side walls of the upper part, such that a positive latching connection of the lower and upper parts occurs. Outer wall parts are additionally integrally molded on the side walls of the upper part, and extend at a distance parallel to the side walls, with a gap existing between their inner surface and the latching hooks of the lower part. This gap is filled with a casting resin following the assembly of the housing, such that the latching hooks are secured in the position illustrated against bending back or detachment, and such that the formation of a pressure-tight encapsulation by the housing is assured. Externally accessible contact clamping bodies for electrical supply lines are arranged on the upper part, which indicates that the housing, obviously intended for motor vehicles, is not intended and is not suitable for use in the industrial environment (process industry).

DE 196 34 671 C2 discloses a cuboidal metal housing of the ignition protection type "Pressure-tight Encapsulation" with a housing lower part and a housing upper part that are formed as shell-shaped and converge at a joint forming an Ex-gap, for example, in the form of a groove-rib connection. The one housing part is provided with a coating in a material-bonded manner at its joint surface, such as the rib, the free surface of which represents a negative impression of the joint surface, such as the groove, of the other housing part in each case and which in the closed state of the housing fills the gap-shaped space, present by design, between both joint surfaces. The two housing parts are held together with screws that are arranged in a region outside the region bounded by the groove.

DE 28 16 691 C2 likewise discloses an explosion-proof pressure-tight housing with a pot-like upper part and with a shell-shaped lower part partially projecting into the upper part, where the gap between the upper part and the lower part is filled with a casting resin.

If explosion-proof pressure-tight housings are conceived, developed and manufactured with the inclusion of all requisite fittings, such as electronic, mechanical or pneumatic components, then this results in expensive housings of complex design with correspondingly large volumes and wall thicknesses.

SUMMARY OF THE INVENTION

In view of the foregoing, it is an object of the invention to exclusively protect fittings during operation within the meaning of ignition protection type "Pressure-tight Encapsulation" for use in the industrial field, which can be regarded as a potential ignition source (in particular electronic modules), in a simply way using small amounts of material.

This and other objects and advantages are achieved in accordance with the invention by an explosion-proof pressure-tight housing for electrical operating devices, consisting of a rigid lower shell and an elastic upper shell terminating the rigid lower shell in the manner of a cover, where the rigid lower shell has a base and side walls, the outer surfaces of which are inclined inwardly by an acute angle between 1.5° and 4°, the elastic upper shell has a cover base and side walls, which are splayed outwardly at the angle, the inside width of the elastic upper shell is smaller than the outside width of the rigid lower shell, and where the elastic upper shell is pressed together with the rigid lower shell such that a flameproof gap is formed between the side walls of the elastic upper shell and the side walls of the rigid lower shell.

To make optimum use of the volume when, for example accommodating electronic modules, the housing is preferably cuboidal, in particular formed as a flat cuboid, with the base of the rigid lower shell and the cover base each in the form of a rounded rectangle.

The core idea of the invention is that the upper part is overdistended and thus rests on the lower part under very high stress, such that even in the event of an explosion no abnormal gap can arise. It is therefore not necessary to fill the gap with casting resin, for example. The inventive Ex-d housing takes into consideration only these operational parts and is configured only for the parts that represent active ignition sources in during operation. Electronic modules generally constitute such ignition sources. The inventive housing has a substantially flat cuboidal structure with a relatively small volume, thereby enabling smaller wall thicknesses and hence a simplification of the configuration and a reduction in weight compared to conventional Ex-d housings. It is not intended that the customer can open the flat Ex-d housing in a non-destructive manner and remove the electronic module from the Ex-d housing.

In accordance with an advantageous embodiment of the inventive housing, the side walls of the elastic upper shell engage around and behind the rigid lower shell at the outer circumferential edge of the base or engage in outer recesses of the lower part. To this end the side walls of the elastic upper shell can be beveled or crimped, or lugs or hooks are formed by stamping or punching, and engage around the base of the lower shell or engage in lateral recesses such as a circumferential groove, for example. As a result the elastic upper shell can, on termination of the pressing together, automatically latch with the rigid lower shell or can be fixed subsequently by production of the engagement from behind, such as by bending.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention along with embodiments and advantages are explained by way of example in the following using the drawings, in which.

DETAILED DESCRIPTION OF THE EXEMPLARY EMBODIMENTS

Figure 1:
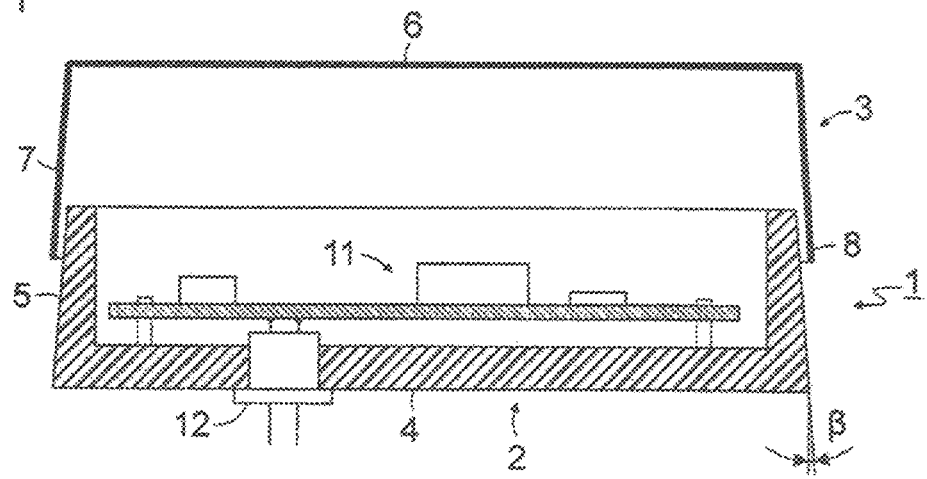
FIG. 1 shows a sectional view of a first exemplary embodiment of the inventive housing with separated upper and lower shell.

Identical parts are provided with identical reference characters in the figures. The illustrations are schematic and not to scale.

Figure 2:
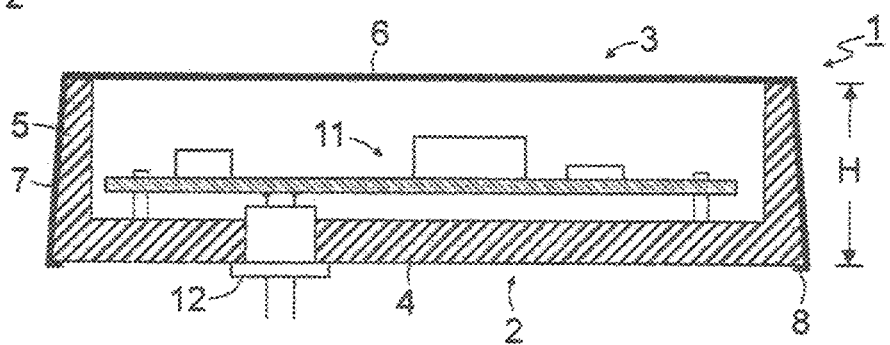
FIG. 2 shows the housing of FIG. 1 with assembled upper and lower shells and securing of the press fit.

FIGS. 1 and 2 show a substantially cuboidal housing 1 consisting of a rigid lower shell 2 and an elastic upper shell 3. The rigid lower shell 2 has a base 4 in the form of a rounded rectangle and side walls 5, the outer surfaces of which are inclined inwardly starting from the base 4 by an acute angle β of approximately 1.5° to 4°, ideally 3°. To achieve the required rigidity, the rigid lower shell 2 is manufactured with a comparatively large wall thickness, such as a milled part (for example, made of stainless steel) or as a metal or plastic cast part with milled and/or ground outer surfaces if appropriate.

Figure 3:
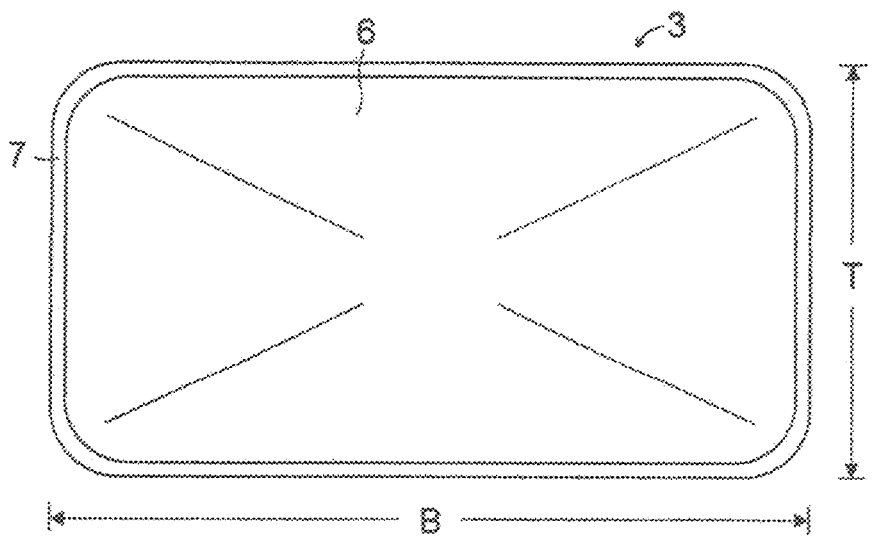
FIG. 3 shows the upper shell in a top view in accordance with the invention.

The upper shell 3, shown in top view in FIG. 3, has a cover base 6, likewise in the form of a rounded rectangle, and side walls 7 that are splayed outwardly by the angle β. To achieve the required elasticity, the elastic upper shell 3 is manufactured with a comparatively thin wall thickness, for example, made of deep-drawing sheet, with a smaller inside width compared to the outside width of the rigid lower shell 2.

FIG. 1 shows the housing 3 with separated elastic upper shell 3 and rigid lower shell 2, and FIG. 2 after both shells 2, 3 have been pressed together. When the elastic upper shell 3 is pressed onto the rigid lower shell 2, the elastic upper shell 3 is stretched such that all tolerances even out and, between the side walls 7 of the elastic upper shell 3 and the side walls 5 of the rigid lower shell 2, a press fit with a zero gap is created, where the gap length corresponds as a function of the selected housing volume to the requirements for explosion protection in accordance with International Electrotechnical Commission (IEC) 60079-1, ANSI/ISA 600791, FM3515 or CSA C22.2 No. 30. The connection of both shells 2, 3 can then no longer be opened without force and the friction forces between them are dimensioned such that they also safely withstand gas explosions in the interior of both shells 2, 3.

To ensure that not only the press fit prevents the elastic upper shell 3 from popping out in the event of an explosion in the interior of the housing 1, a circumferential overhang 8 of the elastic upper shell 3 can, as FIG. 2 shows, be circumferentially folded over at the base 4 of the rigid lower shell 2 after both shells 2, 3 have been pressed together.

Figure 4:
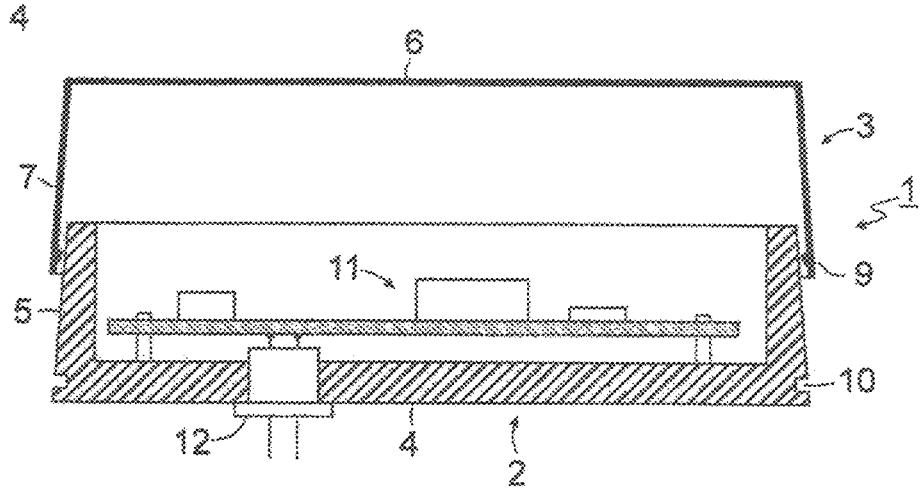
FIG. 4 shows a sectional view of a further exemplary embodiment of the inventive housing with separated upper and lower shells.
Figure 5:
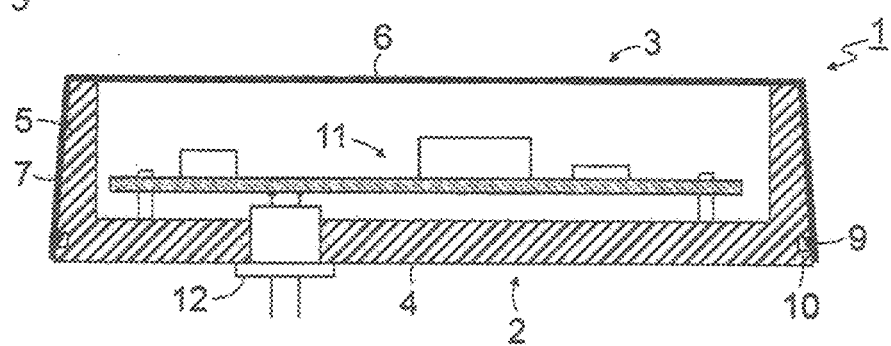
FIG. 5 shows the housing of FIG. 4 with assembled upper and lower shells and securing of the press fit.

FIGS. 4 and 5 show, as an exemplary alternative, tongues 9 formed by punch stamping in the elastic upper shell 3, which after both shells 2, 3 have been pressed together engage in a latched manner in recesses 10 in the side walls 5 of the rigid lower shell 2. Alternatively the tongues 9 or bevels of the side walls 7 of the elastic upper shell 3 can engage around and behind the base 4 of the rigid lower shell 2.

The outer dimensions (approximate dimensions) of the housing 3 are. for example. width B=160 mm, height H=20 mm and depth T=20 mm. Electrical operating devices 11, here an electronic module, are arranged in the housing 1, the electrical connection of which outwardly is enabled by a type-tested or prototype-tested or certified Ex-d lead-in 12 (for example, a T08 socket).

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An explosion-proof pressure-tight housing for electrical operating device, comprising:
    a rigid lower shell having a base and side walls, outer surfaces of which being inclined inwardly by an acute angle of between 1.5° and 4°; and
    an elastic upper shell terminating the lower shell in the manner of a cover, the elastic upper shell having a cover base and side walls which are splayed outwardly by the angle, and inside width of the elastic upper shell being smaller than an outside width of the rigid lower shell;
    wherein the elastic upper shell is pressed together with the rigid lower shell such that a flameproof gap is formed between the side walls of the elastic upper shell and the side walls of the rigid lower shell; and
    wherein the upper shell comprises a circumferential overhang which is configured to be circumferentially folded over the base of the rigid lower shell.

2. The explosion-proof pressure-tight housing as claimed in claim 1, wherein the base of the rigid lower shell and the cover base are formed as a rounded rectangle.

3. The explosion-proof pressure-tight housing as claimed in claim 2, wherein the side walls of the elastic upper shell engage one of (i) around and behind the rigid lower shell at an outer circumferential edge of the base and (ii) in outer recesses of the rigid lower shell.

4. The explosion-proof pressure-tight housing as claimed in claim 1, wherein the side walls of the elastic upper shell engage one of (i) around and behind the rigid lower shell at an outer circumferential edge of the base and (ii) in outer recesses of the rigid lower shell.

5. The explosion-proof pressure-tight housing as claimed in claim 1, wherein the elastic upper shell consists of a deep-drawn sheet.

6. The explosion-proof pressure-tight housing as claimed in claim 5, wherein the deep-drawn sheet is a stainless steel sheet.

7. The explosion-proof pressure-tight housing as claimed in claim 1, wherein characterized in that the rigid lower shell consists of a deep-drawn, milled or cast part with at least one of milled and ground outer surfaces of the side walls.

8. The explosion-proof pressure-tight housing as claimed in claim 1, with the electrical operating device arranged therein forms a flat electronics module.

9. The explosion-proof pressure tight housing as claimed in claim 1, wherein the flameproof gap is formed by the outer surface of the side walls of the lower shell and the inner surface of the upper shell.

* * * * *